United States Patent
Alizadeh-Mousavi et al.

(10) Patent No.: US 12,292,467 B2
(45) Date of Patent: May 6, 2025

(54) METHOD FOR IDENTIFYING AND LOCALIZING FAULTS IN A MEDIUM AND LOW VOLTAGE ELECTRIC POWER DISTRIBUTION GRID USING MEASUREMENTS FROM LOW VOLTAGE PARTS OF THE GRID

(71) Applicant: KRAKENFLEX LIMITED, London (GB)

(72) Inventors: Omid Alizadeh-Mousavi, Jongny (CH); Sotirios Dimitrakopoulos, Zurich (CH)

(73) Assignee: Kraken Technologies Limited (GB)

( * ) Notice: Subject to any disclaimer, the term of this patent is extended or adjusted under 35 U.S.C. 154(b) by 36 days.

(21) Appl. No.: 18/552,516

(22) PCT Filed: Mar. 4, 2022

(86) PCT No.: PCT/IB2022/051910
§ 371 (c)(1),
(2) Date: Sep. 26, 2023

(87) PCT Pub. No.: WO2022/208184
PCT Pub. Date: Oct. 6, 2022

(65) Prior Publication Data
US 2024/0168075 A1    May 23, 2024

(30) Foreign Application Priority Data
Mar. 31, 2021  (EP) ..................... 21166363

(51) Int. Cl.
*G01R 31/08*    (2020.01)
(52) U.S. Cl.
CPC .................. *G01R 31/086* (2013.01)
(58) Field of Classification Search
USPC ....................................................... 324/522
See application file for complete search history.

(56) References Cited

U.S. PATENT DOCUMENTS

2003/0067725 A1   4/2003  Horvath et al.
2006/0125486 A1   6/2006  Premerlani et al.
(Continued)

OTHER PUBLICATIONS

Extended European Search Report; EP Application No. 21166363.8; Aug. 13, 2021.
(Continued)

*Primary Examiner* — Farhana A Hoque
(74) *Attorney, Agent, or Firm* — Farber LLC (57) ABSTRACT

The method for detecting and localizing faults in a MV and LV distribution grid provided with a monitoring infrastructure comprising metering devices assigned to LV nodes of the grid, the monitoring infrastructure comprises a central processing unit and communication means arranged for communication between the metering devices and the central processing unit; wherein the method comprises the following steps: I. have the metering devices measure the voltage v(t) and the current i(t), II. have the metering device calculate, for each one of a succession of evaluation time windows, the mean value of the nodal negative-sequence voltage ($V_{neg}$), as well as a variation of the mean value with respect to the previous evaluation time window, III. have the metering device assess the following criterion for each evaluation time window: "the variation of the mean value of the nodal negative sequence voltage ($V_{neg\text{-}rltv}$) is larger than a given threshold", if the assessment comes out positive for a particular evaluation time window, send a fault notification to the central processing unit. IV. have the central processing unit use fault notifications received during a predefined time lag window to identify the fault location with the help of grid topology information.

18 Claims, 8 Drawing Sheets

(56) References Cited

U.S. PATENT DOCUMENTS

| | | |
|---|---|---|
| 2009/0115427 A1 | 5/2009 | Radtke et al. |
| 2009/0184835 A1* | 7/2009 | Deaver, Sr. ....... H02J 13/00024 |
| | | 340/660 |
| 2019/0277898 A1 | 9/2019 | Beaudet et al. |

OTHER PUBLICATIONS

International Preliminary Report on Patentability; International Application No. PCT/IB2022/051910; Oct. 3, 2023.

International Search Report and Written Opinion; International Application No. PCT/IB2022/051910; May 31, 2022.

* cited by examiner

METHOD FOR IDENTIFYING AND LOCALIZING FAULTS IN A MEDIUM AND LOW VOLTAGE ELECTRIC POWER DISTRIBUTION GRID USING MEASUREMENTS FROM LOW VOLTAGE PARTS OF THE GRID

CROSS-REFERENCE TO RELATED APPLICATIONS

This application is the National Stage of International Application No. PCT/IB2022/051910, filed 4 Mar. 2022, which claims benefit of EP Patent Application No. 21166363.8, filed 31 Mar. 2021, the entire disclosures of which are incorporated herein by reference for all purposes.

The present invention relates to a method for identifying and localizing single-phase and multi-phase faults in a medium and low voltage electric power distribution grid using measurements from low voltage parts of the grid and without the knowledge of the power grid parameters and characteristics.

BACKGROUND OF THE INVENTION

An electric power distribution grid comprises a set of medium voltage (MV) and low voltage (LV) physical nodes, a set of physical MV branches connecting MV nodes to each other, a set of physical LV branches connecting LV nodes to each other, and several MV/LV transformers each arranged to connect an MV node to a LV node. Such an MV and LV distribution grid is typically connected to an upstream (transmission) grid via a HV/MV transformer.

Faults and outages can occur in electrical distribution grids due to human errors, natural events, or to the aging and failure of grid assets. Quick and accurate knowledge of the location of faults in MV and LV grids is the most important and critical responsibility of distribution grid operators in order to minimize the duration of power supply interruption. The distribution grid operators spend huge amounts of effort (manpower) and invest in various infrastructure for fault management, and still a big part of the fault management process is performed manually. Incidentally, the swift management of faults appearing in MV grids is more important than in LV grids, because the number of end-customers impacted is much higher.

Efficient and fast fault management mechanisms are becoming more and more important because i) society relies more and more on an uninterrupted supply of electricity, ii) the infrastructure of many distribution grids is old and prone to failures, iii) extreme weather conditions cause outages, iv) the growth of renewable energy production and of distributed energy resources, as well as the widespread electrification of transportation and of heating and cooling, is putting additional pressure on distribution grids. To face these challenges, the distribution grid operators use various equipment for fault-identification and detection in coordination with their protection systems.

The principal functionalities of the fault indicators are the detection of fault occurrences and the supply of information for fault localization. Fault-location data is provided either as the direction to the location of a fault for the fault indicator with respect to the high voltage transmission grid (upstream vs. downstream) or as a distance from the fault indicator to the fault location (in meters or kilometers). These methods can be generally categorized as 1) fault passage indicator methods, 2) impedance-based methods, 3) and time-reversal based methods.

1) fault passage indicator methods: Most of existing fault detectors in the market provide the fault direction information as upstream and downstream. The methods currently used in the industrial products, such as fault passage indicator (FPI) and earth fault indicator (EFI), are usually based on the following approaches
   Measurement or calculation of zero-sequence current and analysis of its magnitude and harmonics contents.
   Using the signs of voltage and current zero-sequences, known as Wattmetric method.
   Using the signs of active power zero-sequences, known as Wischer method.
   Using the signs of reactive power zero-sequences.
   Analysis of the relationship between zero-sequence voltage (U0) and the integration of zero-sequence current (Q0), known as QU method.
   Analysis of admittances per-phase
   These methods face several challenges for fault identification in MV grids as listed below:
   MV voltages and currents should be measured for which voltage and current transformers are needed. These sensors are expensive, and their installation is difficult requiring supply interruption, maneuver in grid topology, and possible replacement of old infrastructure, e.g. cable headend.
   Use of available MV voltage sensors, e.g., voltage divider of ring main unit, do not provide sufficiently accurate measurements and may result in inaccurate fault identification results.
   They do not provide reliable fault identification results specifically in isolated and compensated grids, and for high impedance faults.
2) Impedance based methods: Impedance based methods estimating the distance between multiple measurement points and fault location by using the information of grid impedance to identify changes in the grid state using state estimation [3], determine the resonant frequency at zero-sequence [1], analyze the voltage drops using the LV measurements [4], and analyze the negative sequence voltages at LV grid [5], [6] and [7].
   The main challenges of using the state estimation-based methods, e.g., in [3], are the need to i) phasor measurement units in MV grids with accurate time synchronization which are expensive measurement infrastructure, and ii) accurate grid topology (i.e., connectivity matrix between nodes and lines) and parameters (i.e., power line resistance, reactance, and susceptance).
   In [1], a resonance frequency-based method is proposed to estimate the distance between the metering unit and the fault location by analysis of resonant frequency of the measured zero-sequence current signals. The main challenges of these methods are the need for i) metering units in MV grids ii) accurate values of grid zero-sequence parameters (i.e. zero-sequence inductance, and susceptance) which should be estimated and not available.
   To alleviate the costs and difficulties associated to the installation of MV metering units, [4], [5], [6] and [7] propose methods using LV grid voltage measurement for MV fault localization.
   In [4], the voltage drops of synchronized voltage phasors at fundamental grid frequency (50 Hz or 60 Hz) at multiple measurement points as well as grid topology and parameters are used as the inputs. The disadvantages of this method are that it cannot provide reliable information in case of single-phase MV faults in certain grounding configurations, such as compensated or in isolated grids, because the fault currents are small in these grounding configurations and the impacts of single-phase MV fault is not visible in the phasors of fundamental frequency. Moreover, this method requires the accurate information of MV grid impedances (i.e. resistance, reactance, and susceptance) as another inputs, which are not always available or trustable. Also, the method is not capable to distinguish that a voltage drop is because of a MV fault or a LV fault.

Reference [5] proposes a method to identify the faulty section in MV grids in case of asymmetrical faults using the ratio of positive to negative-sequence of voltages at the fundamental frequency measured at the LV side of MV/LV transformers. The main challenges of this method are i) it works in grids with neutral grounded and it does not work in compensated and isolated grids where the fundamental frequency component of voltages is not impacted by the faults, ii) it cannot distinguish if a variation in the negative-sequence is because of a LV fault or a MV fault.

In [6] and [7], several possible fault points along a MV feeder are assumed and the fault probability is calculated for all the points. As inputs, this method requires the negative sequence admittance matrix of the MV grid, as well as the measurements of the fundamental frequency for the negative sequence of voltage at LV side of MV/LV transformers as well as the negative sequence of current at every MV feeder departure. The main difficulties of this method are: i) information of grid parameters are not trustable and/or not available, ii) the required measurements at MV and LV should be synchronized, iii) the method is not capable to distinguish that a change in voltage negative-sequence is because of a MV fault or a LV fault or a load variation, iv) the method localizes only MV grid earth faults and does not provide insight for other kind of faults.

3) Time reversal-based methods: these methods use very high frequency sampled signals (in MHz range) and extremely accurate time synchronization (nano-seconds accuracy) to capture the wave propagation between the measurement sensor and the fault location [2]. The main challenges of time reversal methods making them unrealistic for large deployment are the need to i) very expensive sensors in MV grid, ii) accurate grid topology (i.e. connectivity matrix between nodes and lines) and parameters (i.e. power line resistance, reactance, and susceptance), and iii) an external system providing the information of fault time.

The practical use of fault detectors in LV grids is very limited due to i) widely distributed LV grid requiring many fault identification equipment, ii) lack of monitoring infrastructure in distribution grids, iii) lower impact on the number of end-customers without supply in comparison to MV faults. So far, the distribution grid operators are notified about the LV grid faults through end-customers calls or smart meter notifications. These notifications are not always timely resulting in longer supply interruption duration.

SUMMARY OF THE INVENTION

It is therefore an object of the present invention to alleviate the above-mentioned problems in the prior art. The invention achieves this object and others by providing a method for detecting and localizing faults in a medium voltage (MV) and low voltage (LV) distribution grid according to the appended claim 1.

The expression "metering device" should be understood as meaning an electronic device that measures and records data (voltage levels and current for example). The metering devices mentioned in relation to the invention are actually "smart" metering devices, in the sense that they are also capable of processing the information they collect, as well as of communicating with distant devices, in particular for system monitoring.

According to the invention, the distribution grid is provided with a monitoring infrastructure comprising metering devices assigned to particular LV nodes of the distribution grid. Each one of the metering devices is arranged to measure a nodal voltage of the LV node to which it is assigned and a current flowing into or out of said LV node through an upstream branch incident on that particular LV node. The monitoring infrastructure further comprises a central processing unit and a communication means arranged for allowing communication between the metering devices and the central processing unit. One will understand that the method only requires that metering devices be assigned to LV nodes. As it does not require that metering devices be assigned to nodes in the MV part of the grid, the method allows for substantial cost savings and greatly simplifies the implementation of the monitoring infrastructure.

The method of the invention comprises a step (step I) of having the metering device at each one of said particular LV nodes, measure the voltage v(t) and the current i(t) with a sampling rate that is high enough for sampling said voltage and said current over a bandwidth with an upper limit of at least 1 KHz. Metering devices with sampling rates of 2 kHz, preferably up to 12 kHz, are therefore adequate. There is therefore no need for very high sampling frequencies and expensive metering devices.

The method of the invention comprises a step (step II) of having the metering device (8) at each one of said particular LV nodes use the voltages measured in step I to calculate, for each one of a succession of evaluation time windows, the mean value of the nodal negative-sequence voltage ($V_{neg}$), and further calculate variations of the calculated mean values with respect to the previous evaluation time window. The calculated mean values are timestamped on the basis of the particular evaluation time window to which they correspond. The invention does not require, however, that the evaluation time windows used by different metering devices be highly synchronized. In particular, the metering devices do not need to be expensive Phasor Measurement Units (PMUs) having a permanent link to a common time reference. Metering devices capable of timing the successive evaluation time windows, using GPS or NTP for a time reference, signal are sufficiently accurate.

The method of the invention comprises a step (step III) of having the metering device at each one of said particular LV nodes, assess the following criterion for each one of the evaluation time windows except the first one: "the variation of the mean value of the nodal negative-sequence voltage ($V_{neg\text{-}rltv}$) calculated in step II is larger than a first given threshold", if this assessment comes out positive for a particular evaluation time window, have the metering device send a fault notification comprising the calculated variations for the particular evaluation time window to the central processing unit.

The method of the invention comprises a step (step IV) of having the central processing unit use fault notifications received during a predefined time lag window from metering devices assigned to different LV nodes, to identify the fault location with the help of grid topology information.

According to a preferred embodiment, step II of the method also comprises having the metering device (8) at each one of said particular LV nodes use the voltages and currents measured in step I to calculate, for each one of the evaluation time windows, mean values of at least one variable selected from the group consisting of the nodal voltages for all three phases ($V_{3ph}$), the nodal voltage harmonics between 150 Hz and 1000 Hz ($V_{hrm}$) for all three phases, the branch active and reactive powers for all three phases ($P_{3ph}$, $Q_{3ph}$), the branch admittance for all three phases ($Y_{3ph}$), and the "QP ratio" ($QP_{ratio}$) defined as $$\cos\left(\operatorname{atan}\left(\frac{\overline{Q}_{3ph}}{\overline{P}_{3ph}}\right)\right),$$

where $\overline{Q}_{3ph}$ and $\overline{P}_{3ph}$ are the sums of the three phases of $Q_{3ph}$ and $P_{3ph}$ respectively, and further calculate variations of the calculated mean values with respect to the previous evaluation time window.

According to another or to the same preferred embodiment, the method comprises an additional step (step III_prior) between step II and step III. step III_prior allows to identify a fault-type by having the metering device (8) at each one of said particular LV nodes, for each one of the evaluation time windows except the first one, separately check for the occurrence of a 3-phase fault in any part of the distribution grid, for the occurrence of a 2-phase or single-phase fault in the LV part of the distribution grid, and for the occurrence of a 2-phase fault in the MV part of the distribution grid, and further having the metering device (8) send a fault notification to the central processing unit (10) whenever the occurrence of a fault of any one of said fault-types is confirmed for a particular evaluation time window. If a fault-notification is sent, the method goes directly to step IV. If no fault is detected during step III-prior for a particular evaluation time window, the method goes on to step III. According to this preferred embodiment, any fault-notification sent by a metering device (8) during step III is interpreted by the central processing unit (10) as concerning a single-phase fault in the MV part of the distribution grid. Indeed, as step III_prior allows to check for every type of fault except for single-phase faults in the MV part of the grid, if no fault is detected for a particular evaluation time window during step III_prior, and a fault is then detected for that particular time window during step III, the detected fault is necessarily a single-phase fault in the MV part of the grid.

According to still another or to the same preferred embodiment, step III further comprises having the metering device at each one of said particular LV nodes, further assess the following second criterion for each one of the evaluation time windows except the first one: (ii) "the variation of the mean value of the nodal voltage harmonics calculated in step II ($V_{hrm-rltv}$) is larger than a sixth given threshold", if the first and the second assessment both come out positive for a particular evaluation time window, the occurrence of a single-phase fault in the MV part of the distribution grid is validated.

The method is based on the general observation that, If a fault occurs in the MV part of the grid, the voltages in the LV parts of the grid are impacted but the LV currents are relatively unaffected, even in the presence of distributed generators capable of contributing to fault currents in the LV parts of the grid. When a fault occurs in one of the LV parts of the grid, both the voltages and the currents in the LV part of the grid are impacted. Implementing the described method can have the following advantages:

- Only grid topology information is utilized, and the information of grid parameters, which are not trustable or not available in LV and MV grids, are not needed.
- The method uses the steady state as well as the transient information captured by the metering devices for fault identification and localization.
- The method works in different grid topology configuration, e.g. radial, ring, mesh topologies.
- The method of the invention works for underground as well as overhead grids, and for all grid grounding configurations, including isolated, compensated, and solidly grounded. These features make the method suitable for implementations in distribution grids everywhere in the world allowing the distribution grid operators to quickly localize the faults in their grid, reducing the supply interruption duration and pressure on the grid infrastructure.
- The method of the invention uses voltage and current measurements in the LV parts of the grid, preferably at the low voltage side of medium-to-low voltage distribution transformers, to identify fault time, faulty phases, and faulty sections in the MV part of the distribution grid.
- The method of the invention does not require equipping every LV grid node with a metering device. The presence of metering devices at a subset of LV grid nodes is sufficient for the purpose of fault identification in the MV part of the grid as well as in LV parts of the grids equipped with metering devices.

BRIEF DESCRIPTION OF THE DRAWINGS

Other features and advantages of the present invention will appear upon reading the following description, given solely by way of non-limiting example, and made with reference to the annexed drawings, in which.

DETAILED DESCRIPTION OF AN EXAMPLARY IMPLEMENTATION

The subject matter of the present invention is a method for the detection, the localization, and preferably the identification, of various types of faults (three-phase faults, two-phase faults, single-phase faults) in MV and LV parts of distribution grids. Accordingly, as the field to which the invention applies is that of electric power grids, an exemplary grid will first be described. Actual ways in which the method can operate will be explained afterward.

Figure 1:
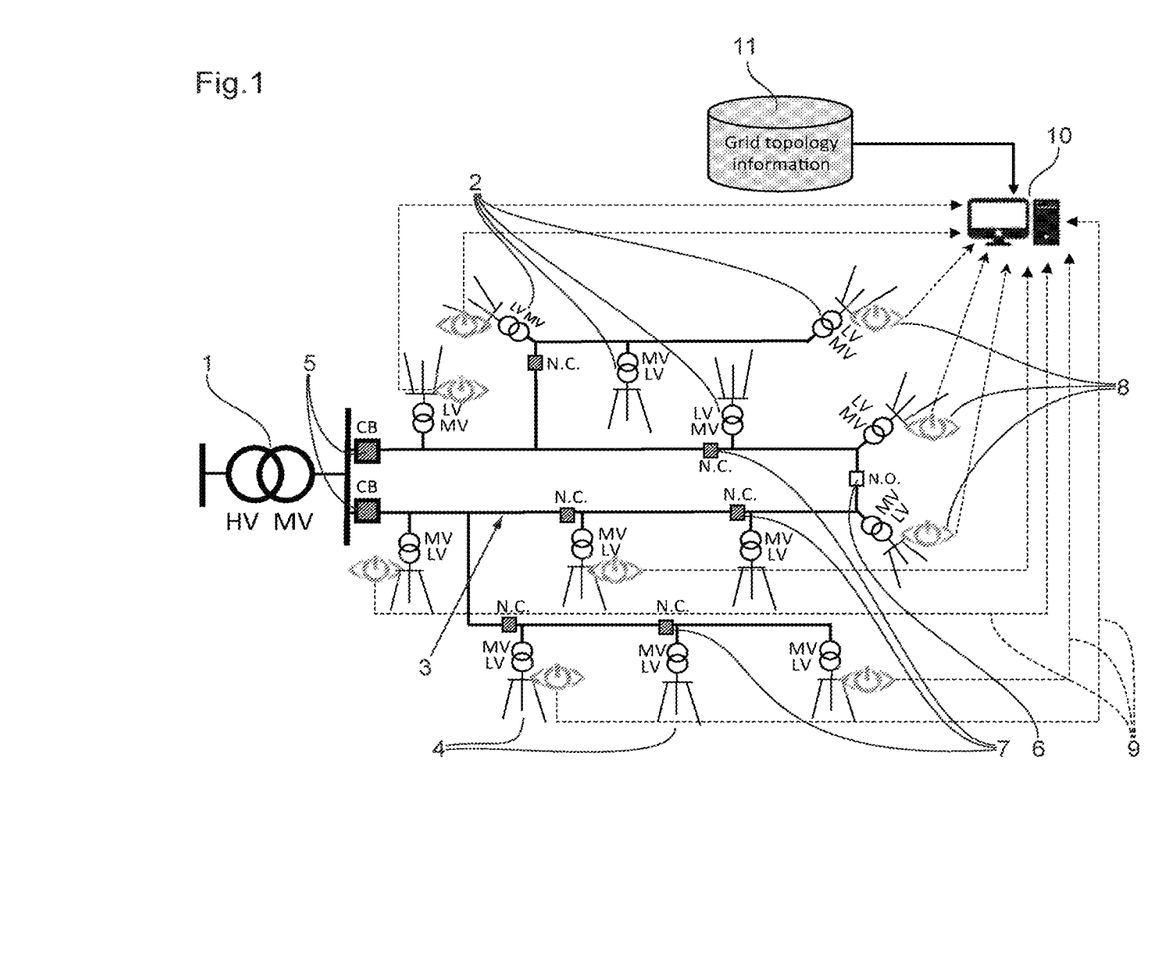
FIG. 1 is a schematic representation of an exemplary power distribution grid provided with a monitoring infrastructure comprising metering devices with decentralized processing capabilities, said devices being arranged at the LV side of a plurality of the MV/LV transformers.

FIG. 1 is schematic representation of an exemplary distribution grid comprising a MV part (referenced 3) and several LV parts (referenced 4). The MV part of the distribution grid is connected to a HV/MV transformer (referenced 1), as well as to a plurality of MV/LV transformers (referenced 2) arranged in such a way as to connect the MV part 3 of the grid with the LV parts 4. The voltage of the electric energy entering the distribution grid through the HV/MV transformer 1 is stepped down from HV to MV. HV corresponds to voltage levels above 40 kV, MV typically corresponds to voltage levels between 1 and 40 kV and LV typically corresponds to voltage levels below 1 kV. The MV part 3 of the gird distributes the electric power at MV level between the LV parts 4 of the distribution grid as well as to large end-customers (not shown) that are connected to the MV part of the distribution grid. The voltage of the electric power that is supplied from the MV part of the grid to the LV parts is stepped down as it passes through the MV/LV transformers 2. The LV parts of the grid are arranged to reach the end-customers. FIG. 1 further shows two short-circuit breakers 5, which constitute an exemplary form of protection equipment adapted to prevent the propagation of outages and grid instability by quickly isolating the faulty distribution grid from the rest of the network. The depicted distribution grid also comprises normally open 6 and normally closed 7 switches arranged to allow changing the grid topology in order either to optimize grid operation in the absence of any fault, or to isolate a faulty section of the grid when a fault occurs. The switches 6 and 7 allow to power-off a particular section of the grid for maintenance purposes, and further to circumvent a fault in order to reconnect as many end-customers as possible, thus minimizing the fault impact on end-customers.

The distribution grid of FIG. 1 is provided with a monitoring infrastructure comprising metering devices with decentralized processing capabilities (referenced 8 and referred to here-after as metering devices). The metering devices are arranged in the LV parts 4 of the grid, preferably at the LV side of MV/LV transformers 2. The monitoring infrastructure also comprises a communication means 9 arranged to allow communication between the metering devices 8 and a central processing unit 10. According to the presently described implementation, the different metering devices 8 are synchronized by means of the Network Time Protocol (NTP) via a preexisting GSM network that also serves as the communication means 9 for the monitoring infrastructure. Advantages of NTP are that it is easy to implement and readily available almost everywhere. The communication means 9 also allows the central processing unit 10 to download information from distant servers. In particular, the central processing unit 10 can use the communication means 9 to up-date its knowledge of the grid's topology. The up-to-date grid topology (11) can be obtained for example from a real-time mapping site, for example the Geographical Information System (GIS).

Figure 4:
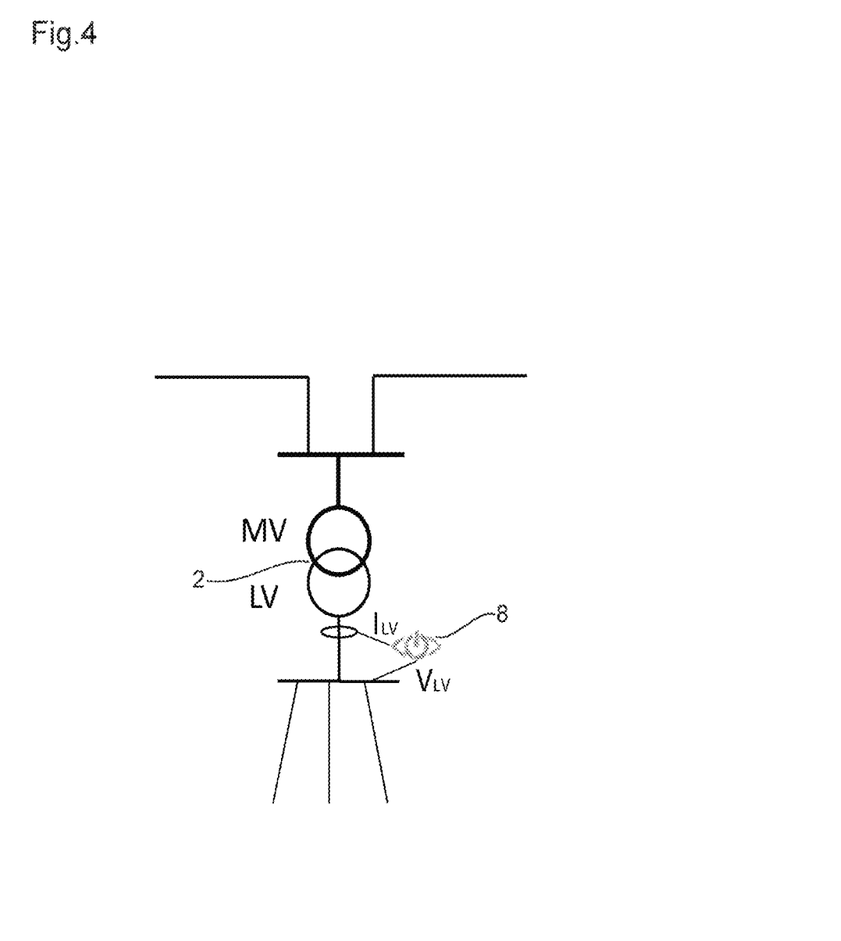
FIG. 4 is a schematic representation of an exemplary implementation of a metering device at the LV side of an MV/LV transformer.

According to the method of the invention, each metering device 8 measures the 3-phase voltage (v(t)) at a particular LV node and the 3-phase current (i(t)) flowing into or out of this particular LV node through an upstream branch incident on the node. As shown in FIG. 4, the metering devices 8 are preferably placed directly at the LV side of the MV/LV transformers 2, so as to measure the 3-phase current (i(t)) flowing into or out of the MV/LV transformer. The metering devices measure the voltages and currents with a sampling rate that is high enough for sampling said voltage and said current over a bandwidth with an upper limit of at least 1 kHz. Metering devices with sampling rates of 2 kHz, preferably up to 12 kHz, are therefore adequate.

As previously noted, the metering devices 8 have decentralized processing capabilities (allowing to implement edge computing). Accordingly, each metering device is capable of computing the mean values of a plurality variables from the 3-phase voltages and currents it measured during any past evaluation time window (T). According to the invention, the a priori defined length (T) of the evaluation time window is equal to between 1 period of the power grid frequency (20 ms for a 50 Hz grid) and 1000 seconds, preferably equal to 100 ms (5 periods for a power grid having a 50 Hz frequency). According to the present exemplary implementation, the metering devices 8 compute mean values of the nodal voltages for all three phases ($V_{3ph}$), of the branch currents for all three phases ($I_{3ph}$), of the branch active and reactive powers for all three phases ($P_{3ph}$, $Q_{3ph}$), of the branch admittance for all three phases ($Y_{3ph}$), of the nodal negative-sequence voltage ($V_{neg}$), and of the nodal voltage harmonics between 150 Hz and 1000 Hz for all three phases ($V_{hrm}$). The metering devices compute these mean values repeatedly for each one of successive 100 ms evaluation time windows, preferably without any idle time between successive evaluation time windows. According to a favorable implementation, these mean values can be computed by the Fourier transformation of voltages and currents at the fundamental frequency for all variables, except for the nodal voltage and the negative-sequence voltage. The mean values of the nodal voltage and of the negative-sequence voltage can be computed by Fourier transformation of voltages at the fundamental frequency, as well as at higher frequencies.

In addition to the mean values, the metering devices 8 further calculate the amount of change of each one of the calculated mean values with respect to the previous evaluation time window. These calculated amounts of change are called the relative values of the variables. The relative values indicate a sudden change in an electrical quantity, which makes them suitable for identifying the occurrence of a fault.

i) mean values of the nodal voltage ($V_{3ph}$) can be calculated per-phase from voltage signals in any particular evaluation time window as RMS or TRMS. The corresponding relative values are designated by the symbol $V_{3ph\text{-}rltv}$.

ii) mean values of the branch current ($I_{3ph}$) can be calculated per-phase from current signals in any particular evaluation time window as RMS or TRMS. The corresponding relative values are designated by the symbol $V_{3ph\text{-}rltv}$.

iii) mean values of the branch active and reactive powers ($P_{3ph}$, $Q_{3ph}$) can be calculated per-phase for any evaluation time window as the average active and reactive powers in any particular evaluation time window. The corresponding relative values are designated by the symbols $P_{3ph\text{-}rltv}$ and $Q_{3ph\text{-}rltv}$.

iv) mean values of the admittance ($Y_{3ph}$) can be calculated per-phase either from the nodal voltage and the branch current or from the nodal voltage and the branch active and reactive powers. The corresponding relative values are designated by the symbol $Y_{3ph\text{-}rltv}$.

v) The mean value of the nodal negative-sequence voltage ($V_{neg}$) can be calculated either by shifting 3-phase instantaneous voltages or as the sum of the voltage phasors for each one of the three phases, taking into account the phasors for higher frequencies as well as for the fundamental frequency. The corresponding relative values are designated by the symbol $V_{neg\text{-}rltv}$.

vi) a "QP ratio" is further defined as $$\cos\left(a\tan\left(\frac{\overline{Q}_{3ph}}{\overline{P}_{3ph}}\right)\right),$$

where $\overline{Q}_{3ph}$ and $\overline{P}_{3ph}$ are the sums of the three phases of $Q_{3ph}$ and $P_{3ph}$ respectfully. The relative value of the QP ratio is designated by the symbol $QP_{ratio\text{-}rltv}$.

vii) The mean value of the nodal voltage harmonics between 150 Hz and 1000 Hz, as the maximum of the voltage harmonics of all three phases at every multiples of the fundamental frequency in the specified frequency range ($V_{hrm}$). The corresponding relative values are designated by the symbol $V_{hrm\text{-}rltv}$.

Figure 5:
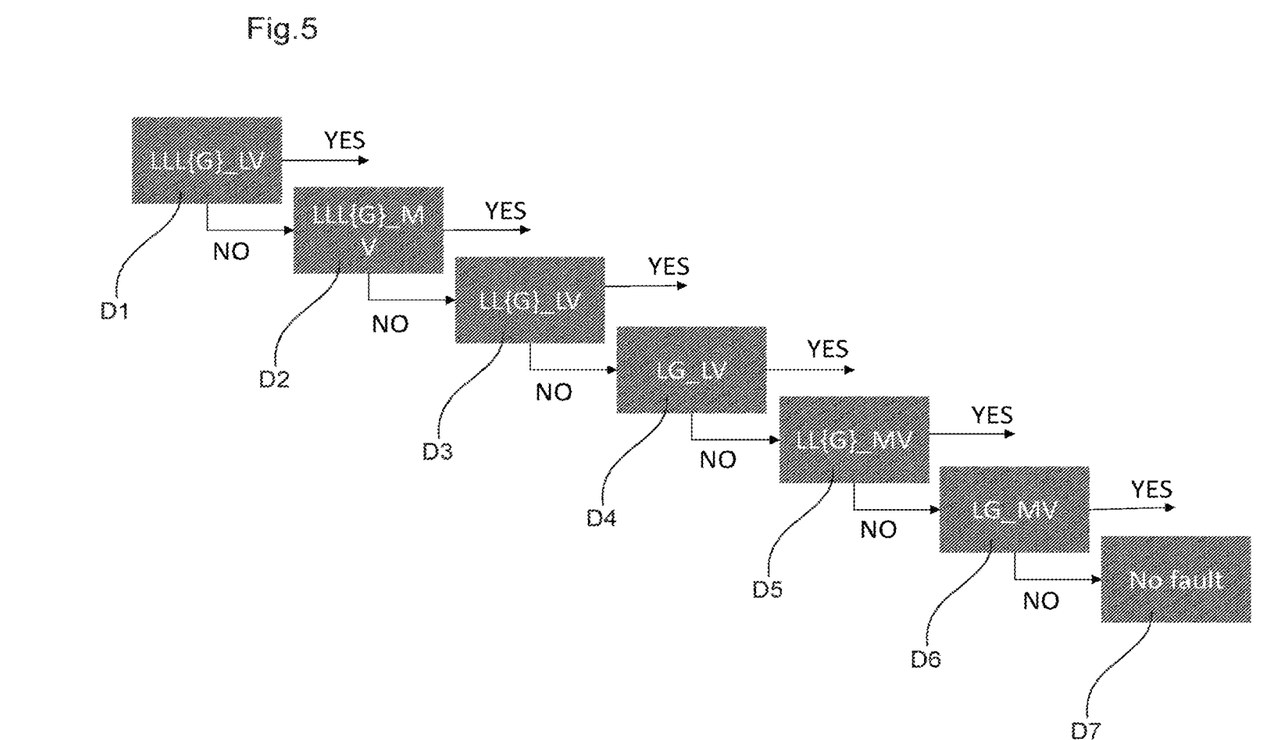
FIG. 5 is a flowchart showing the succession of assessment steps conducted in parallel by each one of the metering devices according to a particular implementation of the method of the invention.

The calculated mean values and relative values can then be used to identify both the fault type and the part of the grid in which the fault has occurred. FIG. 5 is a flowchart describing the decentralized part of a process used, according to the presently described exemplary implementation, in order to identify the fault type, as well the part of the grid in which the fault has occurred. The flow chart of FIG. 5 shows a succession of assessment steps that are preferably conducted in parallel by the metering devices 8. The succession of decentralized assessment steps is implemented cyclically, once for every evaluation time window.

The assessment steps illustrated in FIG. 5 are described below:

Step D1: notify the central processing unit 10 of the occurrence of a 3-phase LV fault, if $Y_{3ph\text{-}rltv}$ is larger than a fourth given threshold for all 3 phases, and $QP_{ratio\text{-}rltv}$ is larger than a fifth given threshold. Otherwise go to step D2.

Step D2: notify the central processing unit 10 of the occurrence of a 3-phase MV fault, if $V_{3ph\text{-}rltv}$ is less than a third given threshold for all 3 phases, and $P_{3ph\text{-}rltv}$, summed over the three phases, is less than a second given threshold. Otherwise go to step D3.

Step D3: notify the central processing unit 10 of the occurrence of a 2-phase LV fault, if $Y_{3ph\text{-}rltv}$ is larger than the fourth given threshold for two of the phases, and $QP_{ratio\text{-}rltv}$ is larger than the fifth given threshold. Otherwise go to step D4.

Step D4: notify the central processing unit 10 of the occurrence of a single-phase LV fault, if $Y_{3ph\text{-}rltv}$ is larger than the fourth given threshold for one of the phases, and $QP_{ratio\text{-}rltv}$ is larger than the fifth given threshold. Otherwise go to step D5.

Step D5: notify the central processing unit 10 of the occurrence of 2-phase MV fault, if $V_{3ph\text{-}rltv}$ is less than the third given threshold for two of the phases, and $P_{3ph\text{-}rltv}$, summed over the three phases, is less than the second given threshold. Otherwise go to step D6.

Step D6: notify the central processing unit 10 of the occurrence of single-phase MV fault, if $V_{neg\text{-}rltv}$ is larger than a first given threshold, and $V_{hrm\text{-}rltv}$ is larger than a sixth given threshold. Otherwise go to step D7.

Step D7: no fault was detected during the last evaluation time window, thus do not send any notification to the central processing unit 10.

The skilled person is capable of determining adequate values for the different thresholds by trial and error starting from the following grid parameters. Vnom stands for the nominal voltage of the particular LV part of the grid which comprises the node to which the metering device is assigned (e.g. 230V). Inom designates the nominal current of the upstream branch incident on said node. Ynom designates the nominal admittance of said upstream branch (Ynom=Inom/Vnom), and finally Snom designates the apparent power of said upstream branch (Snom=Vnom*Inom). One will understand that, according to the preferred implementation, according to which the metering devices are arranged at the LV side of MV/LV transformers, said upstream branch is actually the LV side of the MV/LV transformer.

The first given threshold can be for example 0.0004*Vnom in the case of compensated grids and 0.0035*Vnom for other grids. The first given threshold is usually within a range between 0.0002*Vnom and 0.005*Vnom.

The second given threshold is usually within a range between 0.0002*Snom and 0.0010*Snom. For example 0.0006*Snom.

The third given threshold is usually within a range between 0.0002*Vnom and 0.0010*Vnom. For example 0.00065*Vnom.

The fourth given threshold is usually within a range between 0.0002*Ynom and 0.0010*Ynom. For example 0.0006*Ynom.

The fifth given threshold is usually within a range between 0.970 and 0.999. For example 0.985.

The sixth given threshold is usually within a range between 0.0004*Vnom and 0.0010*Vnom. For example 0.0007*Vnom.

Figure 2:
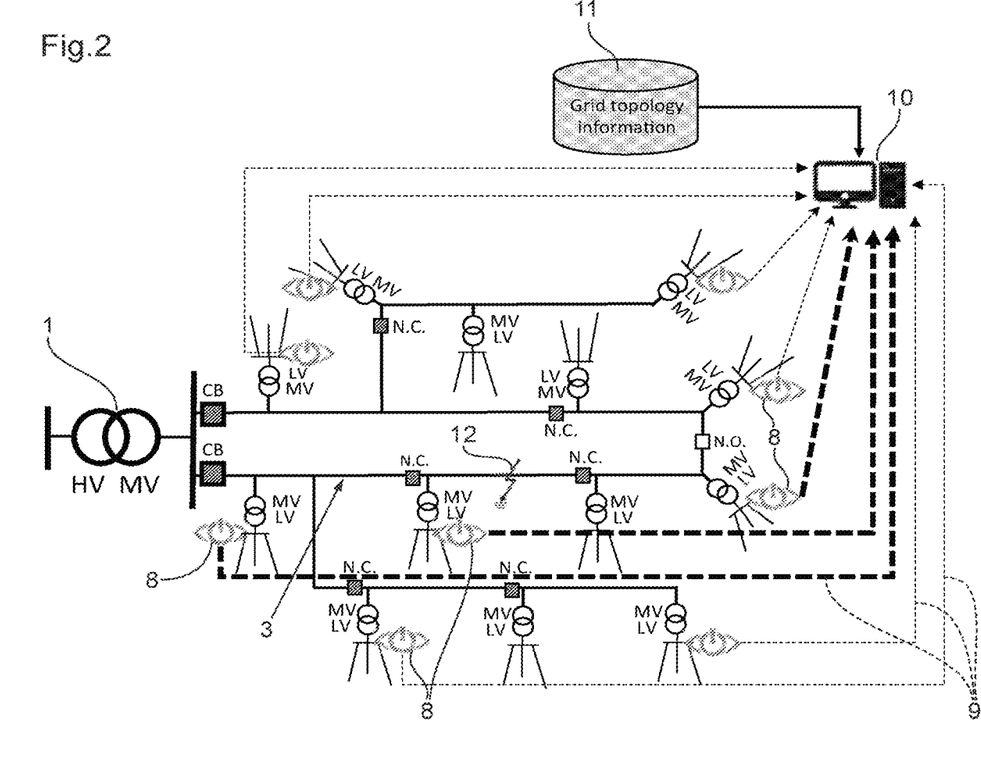
FIG. 2 is a schematic representation of the occurrence of a fault in the MV part of the grid of FIG. 1, and of the consequent notifications sent by some of the metering devices to the central processing unit.

FIG. 2 is a schematic representation of the grid of FIG. 1 shortly after the occurrence of a fault 12 in the MV part 3 of the grid. FIG. 2 shows that some of the metering devices 8 are sending fault-notifications to the central processing unit 10 in accordance with the outcome of one of the assessment steps D2, D5 or D6 (FIG. 5).

Figure 3:
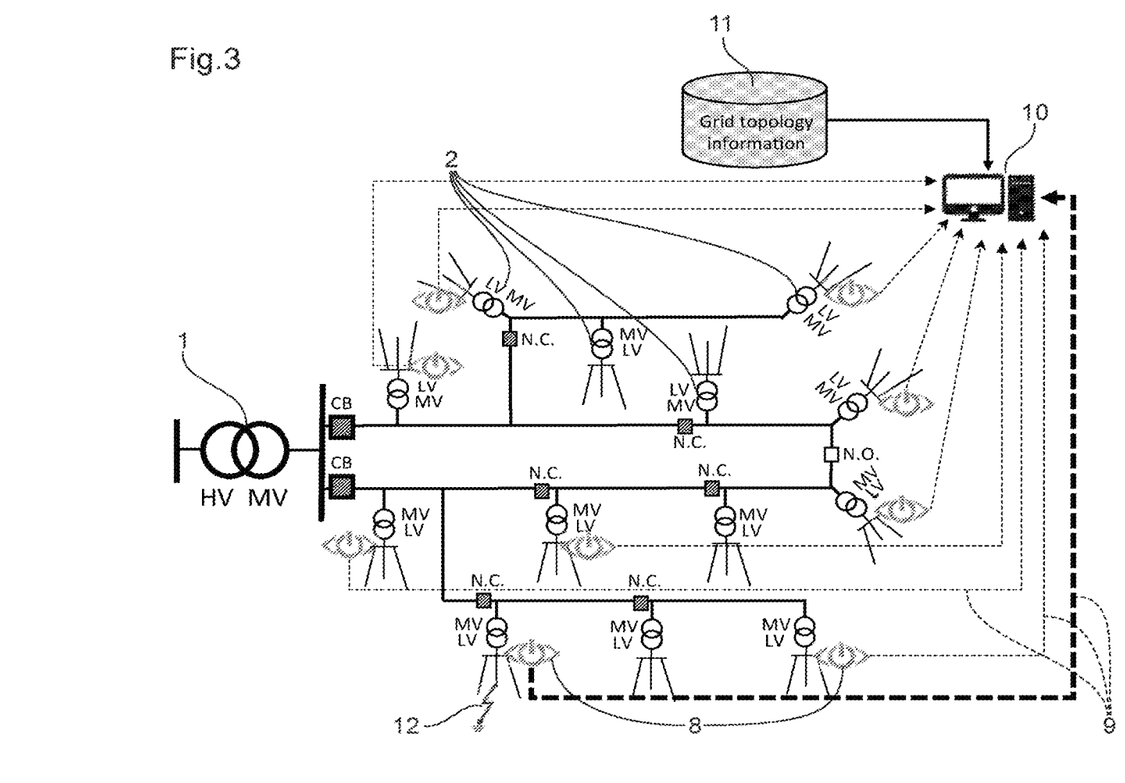
FIG. 3 is a schematic representation of the occurrence of a fault in a LV part of the grid of FIG. 1, and of the consequent notification sent by one of the metering devices to the central processing unit.

FIG. 3 is a schematic representation of the grid of FIG. 1 shortly after the occurrence of a fault 12 in a LV part of the grid. FIG. 3 shows that one of the metering devices 8 is sending a fault-notification to the central processing unit 10 in accordance with the outcome of one of the assessment steps D1, D3 or D4.

Figure 6:
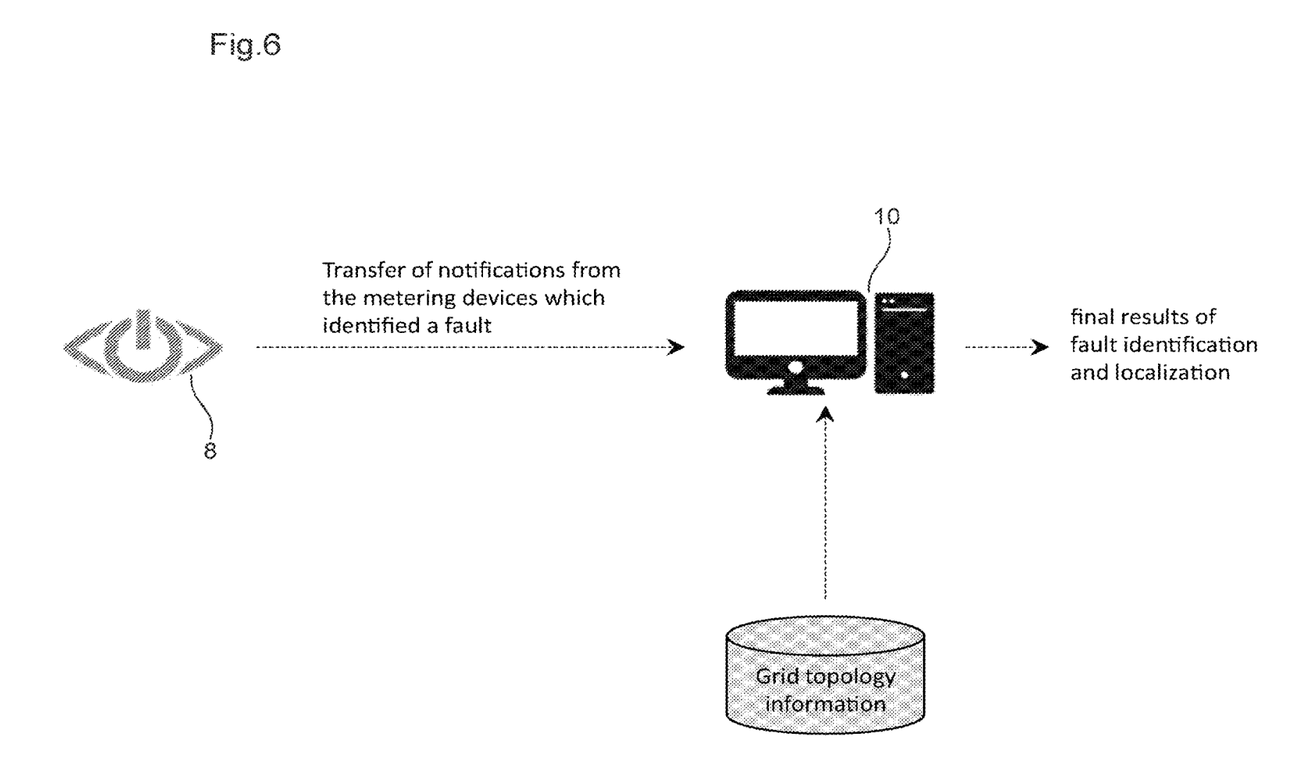
FIG. 6 is a schematic diagram of the identification and localization of a fault by the central processing unit, on the basis of notifications sent by the metering devices as well as of downloaded grid topology data.

The central processing unit 10 processes all the received notifications for fault verification and localization. FIG. 6 is a schematic diagram showing the information that is sent to the central processing unit 10 in order to enable it to identify and localize a fault. As previously mentioned, the invention does not require that the evaluation time windows (T) used by different metering devices 8 be highly synchronized. Indeed, the metering devices 8 can send a fault notification practically as soon as a fault occurs. When the central processing unit 10 receives a notification indicating a fault in the MV part of the grid from a first metering device 8, the reception of the notification opens a time lag window having a predefined length. For example, a 10 seconds-long time lag window in a particular case where the metering devices use NTP as time reference signal. Any notification received from another metering device 8 during the same time lag window and indicating a fault in the MV part of the grid is considered to have to do with the same fault. Indeed, the probability of two unrelated faults occurring during the same time lag window is extremely low.

As shown, the central processing unit 10 relies on information concerning the topology of the grid (downloaded from GIS for example), as well as on the fault-notifications sent by metering devices. The step of acquiring information concerning the topology of the grid is performed once and there is no need for any update, as long as the topology does not change. The central processing unit 10 also gets information as to the location of the particular metering devices and maps this information to the grid topology information. There is no need for any update as long as the location of the metering devices does not change.

Figure 7:
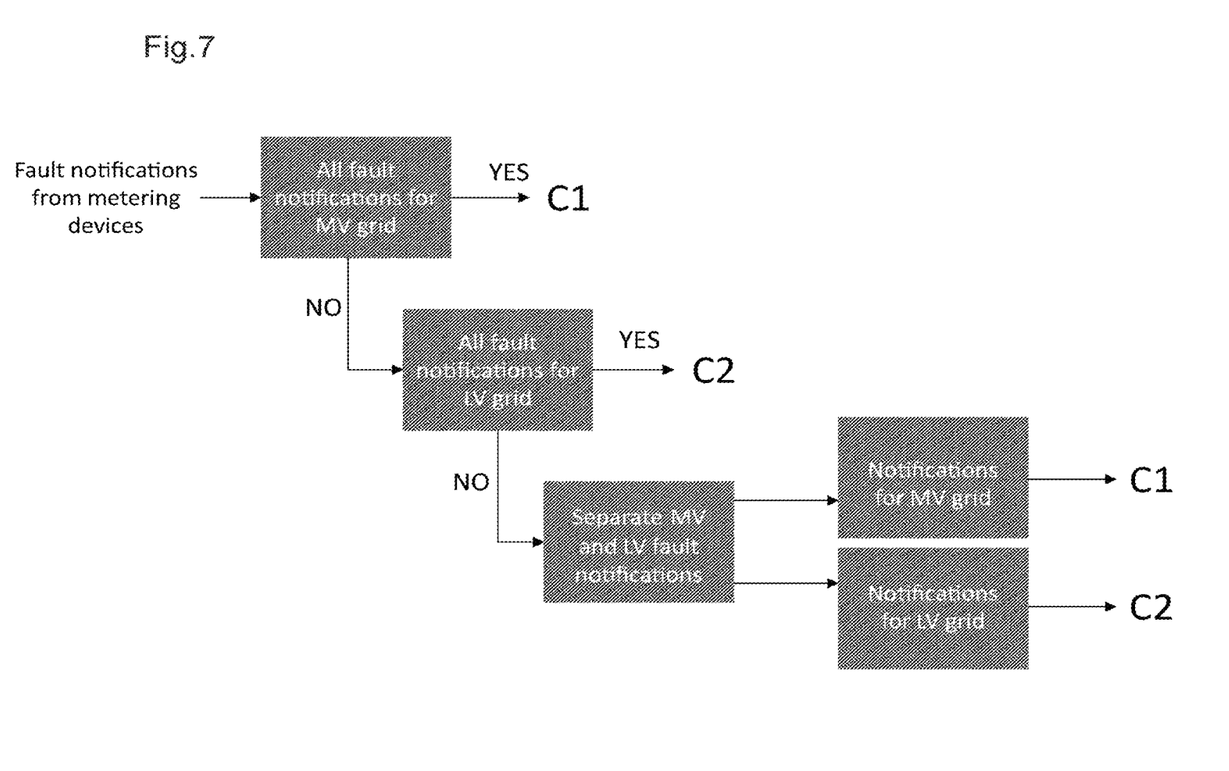
FIG. 7 is a flowchart showing a succession of assessment steps conducted by the central processing unit according to a particular implementation of the method of the invention.
Figure 8:
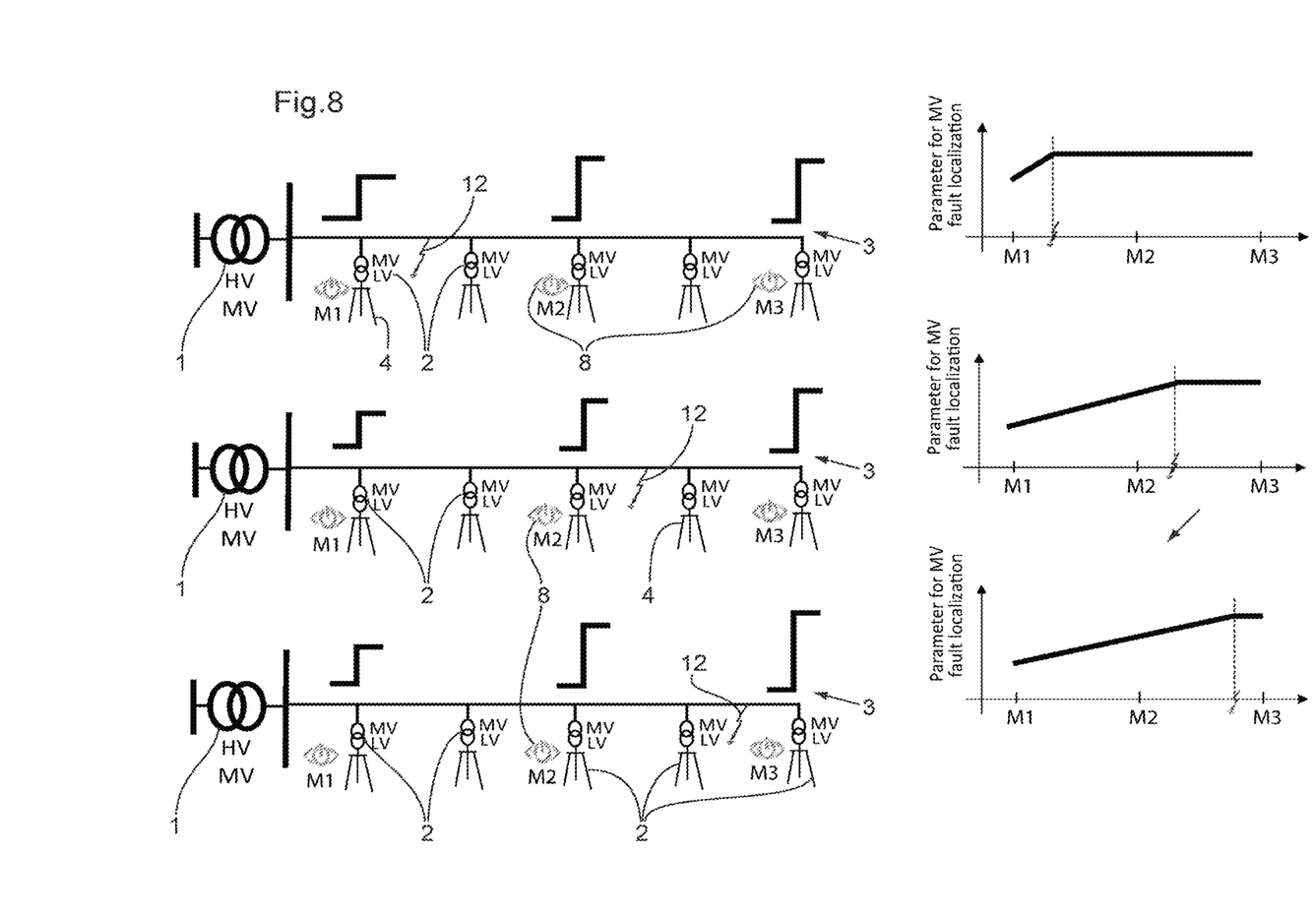
FIG. 8 contains three exemplary schematic diagrams showing how the central processing unit localizes faults in the MV part of a distribution grid according to a particular implementation of the method of the invention.

The central processing unit 10 can use the available information to identify and localize any fault that has occurred. FIG. 7 is a flowchart describing the centralized part of the process used, according to the presently described exemplary implementation, in order to identify the fault type, as well the part of the grid in which the fault has occurred. The flow chart of FIG. 7 shows three assessment steps that can be conducted by the central processing unit 10 in a different order. Implementation of the centralized assessment step can start immediately after the end of a time lag window. The assessment steps illustrated in FIG. 7 are described below:

Step C1: if all fault notifications indicate a MV grid fault, the faulty part of the grid is the MV part 3. The faulty phase is determined as the phase with the highest occurrence in the notifications. Faults in the MV part of the grid can be localized as shown in FIG. 8. In the case of a 3-phase or a 2-phase fault, the "parameter for MV fault localization" referred to in FIG. 8 is the absolute value of the relative value of the nodal voltage $V_{3ph\text{-}rltv}$, and in the case of a single-phase fault, the "parameter for MV fault localization" is the relative value of the nodal negative-sequence voltage $V_{neg\text{-}rltv}$. As shown in FIG. 8, the measured value for the "parameter for MV fault localization" is the same for all metering devices located downstream from the fault. This value is also the highest measured value of the "parameter for MV fault localization". Of all the metering devices having measured this highest value, the one located closest to the HV/MV transformer is the one directly downstream of the fault. Furthermore, the metering device that is located directly upstream of the fault is the metering device that measured the second highest value for the "parameter for MV fault localization". If needed, the exact fault location can be estimated by interpolating the electrical distance and the corresponding parameter between the metering devices 8 identified as being directly upstream and downstream of the fault. FIG. 8 contains three exemplary schematic diagrams showing how this estimation is carried out according to the presently described exemplary implementation.

Step C2: if all fault notifications indicate a LV grid fault, the faulty part of the grid is a LV part 4. If there is more than 1 notification for a LV fault, every notification is analyzed separately. The faulty phase is determined by $Y_{3ph\text{-}rltv}$. If needed, the exact fault location can be estimated by comparing $Y_{3ph\text{-}rltv}$ and the nominal grid admittance.

Step C3: if some fault notifications indicate a LV grid fault and some indicate a MV grid fault, the two kinds of notification are separated from each other, and all the notifications indicating a MV fault are analyzed according to step C1. Each notification indicating a LV fault is analyzed according to step C2.

Although the method of the invention has been illustrated and described in greater detail by means of an exemplary implementation, the invention is not restricted by the disclosed examples and various alterations and/or improvements could be derived therefrom by a person skilled in the art without departing from the scope of the present invention defined by the annexed claims.

REFERENCES

[1] R. Yamamoto; et. all, "Study on Accuracy of Distribution Fault Point Localization by Resonance Frequency Analysis", CIRED 2019, Madrid.
[2] M. Paolone, et. all, Efficient method based on the electromagnetic time reversal to locate faults in power network, U.S. Pat. No. 9,465,067B2, 2013.
[3] M. Pignati, et. all., Fault Detection and Faulted Line Identification in Active Distribution Networks using Synchrophasors-based Real-Time State Estimation, IEEE Trans. Power Deliver, vol. 32, no. 1, 2016, pp: 381-392.
[4] M. Tremblay, Electrical network fault location by distributed voltage measurements, U.S. Pat. No. 8,269, 503B2, 2008.
[5] P. Bountouris, et. all, MV faulted section location in distribution systems based on unsynchronized LV measurements, International Journal of Electrical Power and Energy Systems, vol 119, 2020.
[6] D. Topolanek, et. all, An earth fault location method based on negative sequence voltage changes at low voltage side of distribution transformers, International Journal of Electrical Power and Energy Systems, vol 118, 2020.
[7] D. Topolanek, et. all, Evaluation method for determining of the probability of an asymmetrical fault location in a distribution network and a monitoring system for performing such method, EP2940483B1, 2015.

What is claimed is:

1. A method for detecting and localizing faults in a medium voltage (MV) and low voltage (LV) distribution grid comprising a plurality of MV and LV nodes and a plurality of MV and LV branches, a plurality of MV/LV transformers each arranged to connect one MV node with one LV node; a monitoring infrastructure comprising metering devices assigned to particular LV nodes of the distribution grid, each of one of said metering devices being arranged to measure a nodal voltage of the LV node to which it is assigned and a current flowing into or out of said LV node through an upstream branch incident on said LV node, each one of said particular LV nodes being one of the nodes that a MV/LV transformer is arranged to connect with a MV node, the monitoring infrastructure further comprising a central processing unit and a communication means arranged for allowing communication between the metering devices and the central processing unit (10); wherein the method comprises the following steps:

I. measuring by the metering device at each one of said particular LV nodes, the voltage v(t) and the current i(t) with a sampling rate that is high enough for sampling said voltage and said current over a bandwidth with an upper limit of at least 1 kHz;
   II. calculating by the metering device at each one of said particular LV nodes using the voltages and the currents measured in step I, for each one of a succession of evaluation time windows, the mean value of the nodal negative-sequence voltage ($V_{neg}$), and calculating a variation of the calculated mean value with respect to the previous evaluation time window;

III. assessing by the metering device at each one of said particular LV nodes, the following first criterion for each one of the evaluation time windows except the first one: "the variation of the mean value of the nodal negative-sequence voltage ($V_{neg-rltv}$) calculated in step II is larger than a first given threshold", and when the assessment comes out positive for a particular evaluation time window, sending by the metering device a fault notification comprising the calculated variation for the particular evaluation time window to the central processing unit;

IV. identifying by the central processing unit using fault notifications received during a predefined time lag window from metering devices assigned to different LV nodes, the fault location with the help of grid topology information.

2. The method for detecting and localizing faults in a medium voltage (MV) and low voltage (LV) distribution grid according to claim 1, wherein step II further comprises calculating by the metering device at each one of said particular LV nodes using the measured voltages and currents measured for each one of the evaluation time windows, mean values of at least one variable selected from the group consisting of the nodal voltages for all three phases ($V_{3ph-rltv}$), the nodal voltage harmonics ($V_{hrm}$) as the maximum of the voltage harmonics of all three phases at every multiple of the fundamental frequency comprised in a range between 150 Hz and 1000 Hz, the branch active and reactive powers for all three phases ($P_{3ph}$, $Q_{3ph}$), the branch admittance for all three phases ($Y_{3ph}$), and the "QP ratio" ($QP_{ratio}$) defined as $$\cos\left(\mathrm{atan}\left(\frac{\overline{Q}_{3ph}}{\overline{P}_{3ph}}\right)\right),$$

where $\overline{Q}_{3ph}$ and $\overline{P}_{3vh}$ are the sums of the three phases of $Q_{3ph}$ and $P_{3ph}$ respectively, and further calculating variations of the calculated mean values with respect to the previous evaluation time window; and wherein the method further comprises an additional step (step III_prior), implemented between step II and step III, step III_prior allowing to identify a fault-type by having the metering device at each one of said particular LV nodes, for each one of the evaluation time windows except the first one, separately check for the occurrence of a 3-phase fault in any part of the distribution grid, for the occurrence of a 2-phase or single-phase fault in the LV part of the distribution grid, and for the occurrence of a 2-phase fault in the MV part of the distribution grid and, whenever the occurrence of a fault of any one of said fault-types is confirmed for a particular evaluation time window, further having the metering device send a fault notification for the particular evaluation time window to the central processing unit and have the method go directly to step IV, if no fault is detected during step III-prior for a particular evaluation time window, the method goes on to step III, and wherein any fault notification sent by a metering device during step III is interpreted by the central processing unit as concerning a single-phase fault in the MV part of the distribution grid.

3. The method for detecting and localizing faults in a medium voltage (MV) and low voltage (LV) distribution grid according to claim 2, wherein step III prior comprises a sub step (sub step III_a) consisting in having the metering device at each one of said particular LV nodes use the variations of the calculated mean values in order to check for the occurrence of a 3-phase fault in any part of the distribution grid, whenever this occurrence is confirmed for a particular evaluation time window, have the metering device send a fault notification comprising the variations calculated for the particular evaluation time window to the central processing unit.

4. The method for detecting and localizing faults in a medium voltage (MV) and low voltage (LV) distribution grid according to claim 3, wherein sub step III_a comprises a sub step (sub step D1) of the metering device (8)— assessing the two following criteria for each one of the time windows except the first one: (i) "the variation of the mean value of branch admittance calculated in step II ($Y_{3ph-rltv}$) is larger than a fourth given threshold for all three phases" and (ii) "the variation of the "QP ratio" calculated in step II ($QP_{ratio-rltv}$) is larger than a fifth given threshold", if both assessments come out positive for a particular evaluation time window, the occurrence of a 3-phase fault in the LV part of the distribution grid is confirmed.

5. The method for detecting and localizing faults in a medium voltage (MV) and low voltage (LV) distribution grid according to claim 3, wherein sub step III_a comprises a sub step (sub step D2) of the metering device (8)— assessing the two following criteria for each one of the time windows except the first one: (i) "the variation of the mean value of the nodal voltage calculated in step II ($V_{3ph-rltv}$) is less than a third given threshold for all three phases" and (ii) "the variation of the mean value of the branch active power calculated in step II ($P_{3ph-rltv}$), and summed over the three phases, is less than a second given threshold", if both assessments come out positive for a particular evaluation time window, the occurrence of a 3-phase fault in the MV part of the distribution grid is confirmed.

6. The method for detecting and localizing faults in a medium voltage (MV) and low voltage (LV) distribution grid according to claim 3, wherein step III prior comprises a sub step (sub step III_b) consisting in having the metering device at each one of said particular LV nodes use the variations of the mean values to check for the occurrence of a 2-phase or a single-phase fault in a LV part of the distribution grid, whenever this occurrence is confirmed for a particular evaluation time window, have the metering device send a fault notification comprising the variations calculated for the particular evaluation time window to the central processing unit and jump to step IV.

7. The method for detecting and localizing faults in a medium voltage (MV) and low voltage (LV) distribution grid (3, 4) according to claim 6, wherein sub step III_b comprises a sub step (sub step D3) of the metering device (8) assessing the two following criteria for each one of the time windows except the first one: (i) "the variation of the mean value of branch admittance calculated in step II ($Y_{3ph-rltv}$) is larger than the fourth given threshold for two phases" and (ii) "the variation of the "QP ratio" calculated in step II ($QP_{ratio-rltv}$) is larger than the fifth given threshold", if both assessments come out positive for a particular evaluation time window, the occurrence of a 2-phase fault in a LV part of the distribution grid is confirmed.

8. The method for detecting and localizing faults in a medium voltage (MV) and low voltage (LV) distribution grid (3, 4) according to claim 6, wherein sub step III_b comprises a sub step (sub step D4) of the metering device (8) assessing the two following criteria for each one of the time windows except the first one: (i) "the variation of the mean value of branch admittance calculated in step II ($Y_{3ph\text{-}rltv}$) is larger than a fourth given threshold for one phase" and (ii) "the variation of the "QP ratio" calculated in step II ($QP_{ratio\text{-}rltv}$) is larger than a fifth given threshold", if both assessments come out positive for a particular evaluation time window, the occurrence of a single-phase fault in a LV part of the distribution grid is confirmed.

9. The method for detecting and localizing faults in a medium voltage (MV) and low voltage (LV) distribution grid according to claim 6, wherein step III prior comprises a sub step (sub step III_c) consisting in having the metering device at each one of said particular LV nodes use the variations of the mean values to check for the occurrence of a 2-phase fault in the MV part of the distribution grid, whenever this occurrence is confirmed for a particular evaluation time window, have the metering device send a fault notification comprising the variations calculated for the particular evaluation time window to the central processing unit and jump to step IV.

10. The method for detecting and localizing faults in a medium voltage (MV) and low voltage (LV) distribution grid according to claim 9, wherein sub step III_c comprises a sub step (sub step D5) of the metering device (8) assessing the two following criteria for each one of the time windows except the first one: (i) "the variation of the mean value of the nodal voltage calculated in step II ($V_{3ph\text{-}rltv}$) is less than the third given threshold for two phases" and (ii) "the variation of the mean value of the branch active power calculated in step II ($P_{3ph\text{-}rltv}$), and summed over the three phases, is less than the second given threshold", if both assessments come out positive for a particular evaluation time window, the occurrence of a 2-phase fault in the MV part of the distribution grid is confirmed.

11. The method for detecting and localizing faults in a MV and LV distribution grid according to claim 9, wherein sub step III_b is implemented after sub step III_a, and sub step III_c is implemented after sub step III_b.

12. The method for detecting and localizing faults in a MV and LV distribution grid according to claim 1 10, wherein step III further comprises having the metering device at each one of said particular LV nodes, further assess the following second criterion for each one of the evaluation time windows except the first one: (ii) "the variation of the mean value of the nodal voltage harmonics calculated in step II ($V_{hrm\text{-}rltv}$) is larger than a sixth given threshold", if the first and the second assessment both come out positive for a particular evaluation time window, the occurrence of a single-phase fault in the MV part of the distribution grid is validated.

13. The method for detecting and localizing faults in a MV and LV distribution grid according to claim 1, wherein the method further estimates the distance of a metering device to the fault location by interpolating the electrical distance and the calculated variations between the identified metering device closest to the fault and its neighboring metering devices.

14. The method for detecting and localizing faults in a MV and LV distribution grid according to claim 1, wherein the mean values of variables are calculated by the Fourier transformation of voltage and current measurements at the fundamental frequency and other frequencies higher than the distribution grid's nominal frequency.

15. The method for detecting and localizing faults in a MV and LV distribution grid according to claim 1, wherein each one of said particular LV nodes is one of the nodes that a MV/LV transformer is arranged to connect with a MV node.

16. The method for detecting and localizing faults in a MV and LV distribution grid according to claim 1, wherein the communication means is a preexisting commercial network provided by a mobile operator.

17. The method for detecting and localizing faults in a MV and LV distribution grid according to claim 1, wherein the metering devices are synchronized by means of the Network Time Protocol (NTP) via the communication means.

18. The method for detecting and localizing faults in a MV and LV distribution grid according to claim 1, wherein one of the metering devices-serves as the central processing unit.

* * * * *